United States Patent
Kim et al.

(10) Patent No.: US 11,049,814 B2
(45) Date of Patent: Jun. 29, 2021

(54) SEMICONDUCTOR DEVICE INCLUDING A THROUGH CONTACT EXTENDING BETWEEN SUB-CHIPS AND METHOD OF FABRICATING THE SAME

(71) Applicant: SAMSUNG ELECTRONICS CO., LTD., Suwon-si (KR)

(72) Inventors: Euiyeol Kim, Yongin-si (KR); Sun-Hyun Kim, Anyang-si (KR); Heewoo Park, Seoul (KR)

(73) Assignee: Samsung Electronics Co., Ltd.

( * ) Notice: Subject to any disclaimer, the term of this patent is extended or adjusted under 35 U.S.C. 154(b) by 99 days.

(21) Appl. No.: 16/553,018

(22) Filed: Aug. 27, 2019

(65) Prior Publication Data
US 2020/0266150 A1  Aug. 20, 2020

(30) Foreign Application Priority Data
Feb. 18, 2019 (KR) ........................ 10-2019-0018425

(51) Int. Cl.
| | |
|---|---|
| *H01L 23/538* | (2006.01) |
| *H01L 23/522* | (2006.01) |
| *H01L 21/768* | (2006.01) |
| *H01L 25/065* | (2006.01) |
| *H01L 23/528* | (2006.01) |

(52) U.S. Cl.
CPC .... *H01L 23/5386* (2013.01); *H01L 21/76816* (2013.01); *H01L 21/76877* (2013.01); *H01L 23/528* (2013.01); *H01L 23/5226* (2013.01); *H01L 25/0657* (2013.01)

(58) Field of Classification Search
CPC combination set(s) only.
See application file for complete search history.

(56) References Cited

U.S. PATENT DOCUMENTS

| | | | |
|---|---|---|---|
| 6,686,269 B2 | 2/2004 | Sakamori | |
| 9,773,831 B1* | 9/2017 | Yang | ................ H01L 27/14634 |
| 10,014,285 B2 | 7/2018 | Kim et al. | |
| 2003/0015796 A1 | 1/2003 | Hasunuma | |
| 2011/0233702 A1* | 9/2011 | Takahashi | ......... H01L 27/14636 257/432 |
| 2012/0267740 A1* | 10/2012 | Okamoto | .......... H01L 27/14636 257/432 |

(Continued)

FOREIGN PATENT DOCUMENTS

JP     2002-176098 A     6/2002

*Primary Examiner* — Nduka E Ojeh
(74) *Attorney, Agent, or Firm* — Myers Bigel, P.A.

(57) ABSTRACT

A semiconductor device may include first and second sub chips stacked sequentially and a through contact electrically connecting the first and second sub chips to each other. Each of the first and second sub chips may include a substrate and a plurality of interconnection lines, which are interposed between the substrates. The interconnection lines of the second sub chip may include first and second interconnection lines having first and second openings, respectively, which are horizontally offset from each other. The through contact may be extended from the substrate of the second sub chip toward the first sub chip and may include an auxiliary contact, which is extended toward the first sub chip through the first and second openings and has a bottom surface higher than a top surface of the uppermost one of the interconnection lines of the first sub chip.

20 Claims, 13 Drawing Sheets

(56) References Cited

U.S. PATENT DOCUMENTS

| | | | |
|---|---|---|---|
| 2013/0082401 A1* | 4/2013 | Fukasawa | H01L 25/50 257/774 |
| 2017/0040373 A1* | 2/2017 | Kim | H01L 23/481 |
| 2017/0040374 A1* | 2/2017 | Oh | H01L 23/481 |
| 2017/0110569 A1* | 4/2017 | Chang | H01L 21/76895 |
| 2017/0207158 A1* | 7/2017 | Kang | H01L 23/49811 |
| 2019/0198552 A1* | 6/2019 | Park | H01L 24/80 |
| 2019/0363048 A1* | 11/2019 | Zhao | H01L 21/76879 |

\* cited by examiner

SEMICONDUCTOR DEVICE INCLUDING A THROUGH CONTACT EXTENDING BETWEEN SUB-CHIPS AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2019-0018425, filed on Feb. 18, 2019, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor device including semiconductor chips stacked in a wafer level and a method of fabricating the same.

Due to the small-sized, multifunctional, and/or low-cost characteristics of semiconductor devices, they are considered as important elements in the electronics industry. The semiconductor devices are classified into memory devices for storing data, logic devices for processing data, and hybrid devices including both memory and logic elements. To meet the increased demand for electronic devices with fast speed and/or low power consumption, it may be necessary to realize semiconductor devices with high reliability, high performance, and/or multiple functions. To satisfy these technical parameters, complexity and/or integration density of semiconductor devices are being increased.

An image sensor is a device that converts optical images into electrical signals. With the increased development of the computer and communications industries, there is an increasing demand for high performance image sensors in a variety of applications such as digital cameras, camcorders, personal communication systems, gaming machines, security cameras, micro-cameras for medical applications, and/or robots.

The image sensors are generally classified into charge-coupled device (CCD) and complementary metal-oxide semiconductor (CMOS) image sensors. For the CMOS image sensors, it may be possible to reduce a size of products because the CMOS image sensor may be operated by a simple operation method and signal-processing circuits of the CMOS image sensor may be integrated on a single chip. In addition, CMOS image sensors have relatively low power consumption, and thus may be used in products with limited battery capacity.

SUMMARY

Some embodiments of the inventive concept provide a semiconductor device, in which a through contact with high structural stability is provided.

Some embodiments of the inventive concept provide a method of fabricating a semiconductor device, in which a through contact with high structural stability is provided.

According to some embodiments of the inventive concept, a semiconductor device may include a first sub chip including a first substrate and a first plurality of interconnection lines on the first substrate, a second sub chip including a second substrate and a second plurality of interconnection lines on the second substrate. The second sub chip is stacked on the first sub chip, the first interconnection lines of the first sub chip and the second interconnection lines of the second sub chip are between the first and second substrates, and a through contact extends from the second substrate toward the first sub chip to electrically connect the first and second sub chips to each other. The second plurality of interconnection lines of the second sub chip may include a first interconnection line with a first opening and a second interconnection line with a second opening. A center of the second opening may be horizontally offset from a center of the first opening in a direction parallel to the first substrate and the second substrate. The through contact may include an auxiliary contact that extends in the first opening and the second opening and toward the first sub chip. A level of a bottom surface of the auxiliary contact may be higher than a level of a top surface of an uppermost interconnection line of the first plurality of interconnection lines of the first sub chip.

According to some embodiments of the inventive concept, a semiconductor device may include a first sub chip including a first substrate and a first plurality of interconnection lines on the first substrate, a second sub chip including a second substrate and a second plurality of interconnection lines on the second substrate. The second sub chip is stacked on the first sub chip. The semiconductor device includes a through contact that penetrates the second sub chip and electrically connects the first and second sub chips to each other. The second plurality of interconnection lines of the second sub chip may include a first interconnection line with a first opening and a second interconnection line with a second opening. A center of the second opening may be horizontally offset from a center of the first opening. The through contact may include an auxiliary contact extending in the first opening and the second opening and toward the first sub chip and a main contact electrically connected to an uppermost interconnection line of the first plurality of interconnection lines of the first sub chip. A level of a bottom surface of the auxiliary contact may be higher than a level of a bottom surface of the main contact.

According to some embodiments of the inventive concept, a semiconductor device may include a first substrate, a lower interconnection line on the first substrate and an upper interconnection line on the lower interconnection line, and a through contact vertically extending from the upper interconnection line to the lower interconnection line to electrically connect the upper and lower interconnection lines to each other. The upper interconnection line may include a first interconnection line having a first opening and a second interconnection line on the first interconnection line and having a second opening. A center of the second opening may be horizontally offset from a center of the first opening in a direction parallel to the first substrate and the second substrate. The through contact may include an auxiliary contact extending in the second opening and the first opening and toward the first substrate, and a main contact electrically connected to the lower interconnection line. A level of a bottom surface of the auxiliary contact may be higher than a level of a bottom surface of the main contact.

According to some embodiments of the inventive concept, a method of fabricating a semiconductor device may include forming a first sub chip including a first substrate and a first plurality of interconnection lines on the first substrate, forming a second sub chip including a second substrate and a second plurality of interconnection lines on the second substrate, stacking the first sub chip and the second sub chip to face each other, forming a through contact hole to penetrate the second sub chip and to expose an uppermost interconnection line of the first plurality of interconnection lines of the first sub chip, and forming a through contact to fill the through contact hole. The forming of the second sub chip may include forming a first interconnection line, which is one of the second plurality of interconnection lines and has a first opening, and forming a second interconnection line on the first interconnection line to have a second opening, which is horizontally offset from the first opening. The forming of the through contact hole may include an auxiliary contact hole extending through the first opening and the second opening. A level of a bottom surface of the auxiliary contact hole may be higher than a level of a top surface of the uppermost interconnection line of the first sub chip.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of modules, layers, regions and/or structural elements may be reduced or exaggerated for clarity. The use of similar or identical reference numbers in the various drawings is intended to indicate the presence of a similar or identical element or feature.

DETAILED DESCRIPTION

FIGS. 1A, 2A, 3A, and 4A are plan views illustrating a method of forming a through contact of a semiconductor device, according to some embodiments of the inventive concept. FIGS. 1B, 2B, 3B, and 4B are sectional views taken along lines I-I' of FIGS. 1A, 2A, 3A, and 4A, respectively.

Figure 1A:
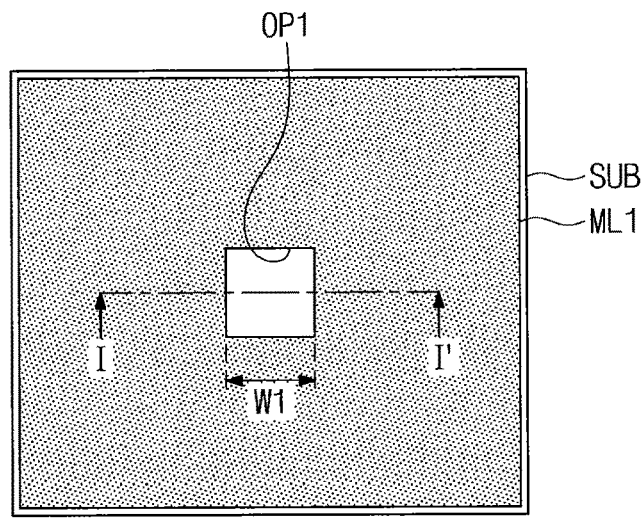
FIGS. 1A, 2A, 3A, and 4A are plan views illustrating a method of forming a through contact of a semiconductor device, according to some embodiments of the inventive concept.
Figure 1A:
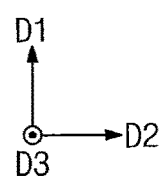
Figure 1B:
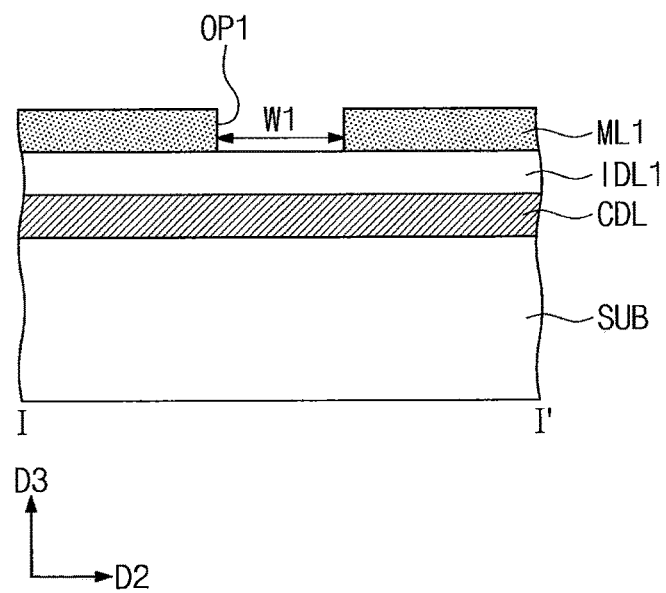
FIGS. 1B, 2B, 3B, and 4B are sectional views taken along lines I-I' of FIGS. 1A, 2A, 3A, and 4A, respectively.

Referring to FIGS. 1A and 1B, a conductive layer CDL may be formed on a substrate SUB. Although not shown, the conductive layer CDL may be electrically connected to a device (e.g., a transistor) formed on the substrate SUB. According to some embodiments, the conductive layer CDL may be an interconnection layer on the transistor. In some embodiments, the conductive layer CDL may be a gate electrode of the transistor. In some embodiments, the conductive layer CDL may be source/drain electrodes of the transistor. The conductive layer CDL may be formed of or include one of doped semiconductor materials (doped silicon, doped germanium, and so forth), conductive metal nitrides (titanium nitride, tantalum nitride, and so forth), metallic materials (tungsten, titanium, tantalum, and so forth), or metal-semiconductor compounds (tungsten silicide, cobalt silicide, titanium silicide, and so forth).

A first insulating layer IDL1 may be formed on the conductive layer CDL. A first mask layer ML1 may be formed on the first insulating layer IDL1. A first opening OP1 may be formed in the first mask layer ML1. The formation of the first opening OP1 may include forming a photoresist pattern on the first mask layer ML1 and patterning the first mask layer ML1 using the photoresist pattern as an etch mask.

The first opening OP1 may have a first width W1, when measured in a second direction D2. As an example, the first opening OP1 may have the minimum feature size, which can be realized by an exposure process for forming the photoresist pattern. A top surface of the first insulating layer IDL1 may be partially exposed through the first opening OP1.

Figure 2A:
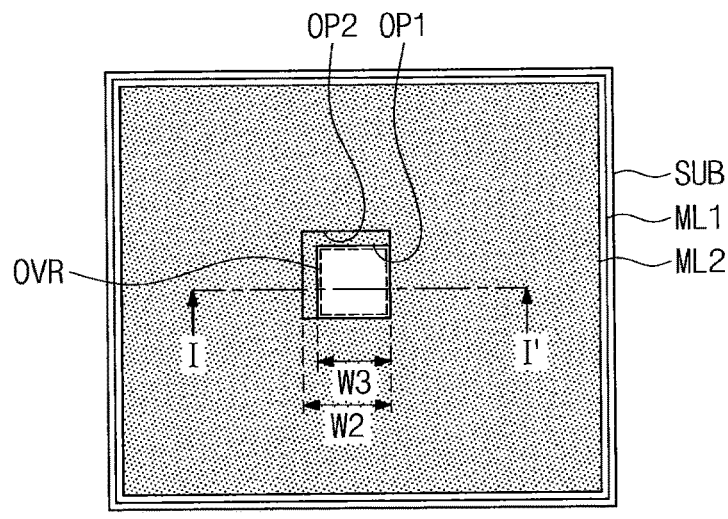
Figure 2B:
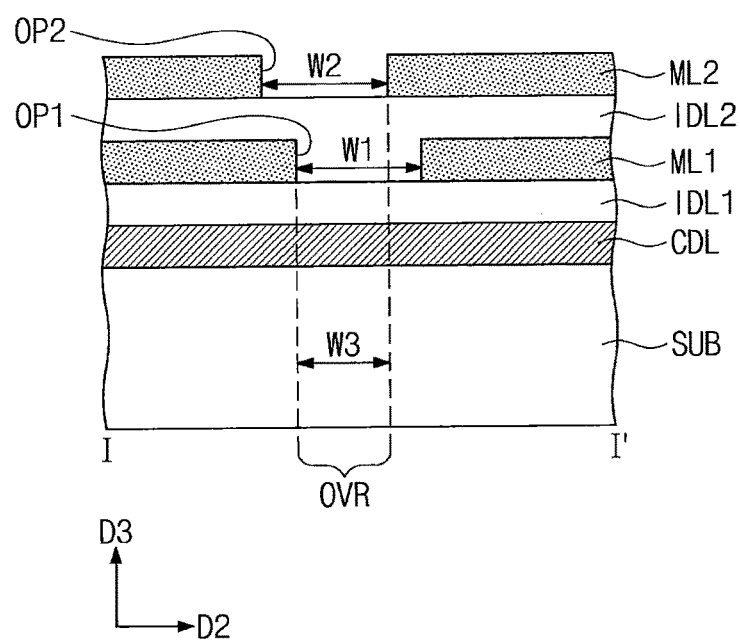

Referring to FIGS. 2A and 2B, a second insulating layer IDL2 may be formed on the first mask layer ML1. The second insulating layer IDL2 may be in or may fill the first opening OP1. A second mask layer ML2 may be formed on the second insulating layer IDL2. A second opening OP2 may be formed in the second mask layer ML2. The second opening OP2 may have a second width W2 in the second direction D2. The second width W2 may be less than, larger than, or substantially equal to the first width W1. In other words, a planar size of the second opening OP2 may be less than, larger than, or substantially equal to a planar size of the first opening OP1.

The second opening OP2 may be formed to be offset from the first opening OP1. A center of the second opening OP2 may be offset from a center of the first opening OP1. The center of the second opening OP2 may be offset from the center of the first opening OP1 in one or both of the first and second directions D1 and D2. When viewed in a plan view, the second opening OP2 and the first opening OP1 may be partially overlapped with each other, and an overlap region OVR will be used to refer to such a partially-overlapped region between the first and second openings OP1 and OP2.

The overlap region OVR may have a third width W3 in the second direction D2. The third width W3 may be less than the first width W1 and may be less than the second width W2. In other words, a planar size of the overlap region OVR may be less than the planar size of the first opening OP1 and may be less than the planar size of the second opening OP2.

Figure 3A:
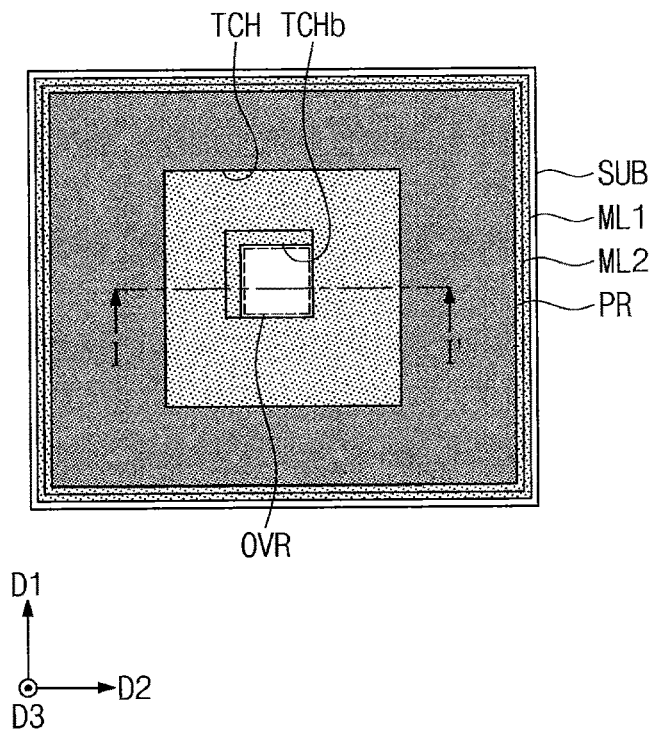
Figure 3B:
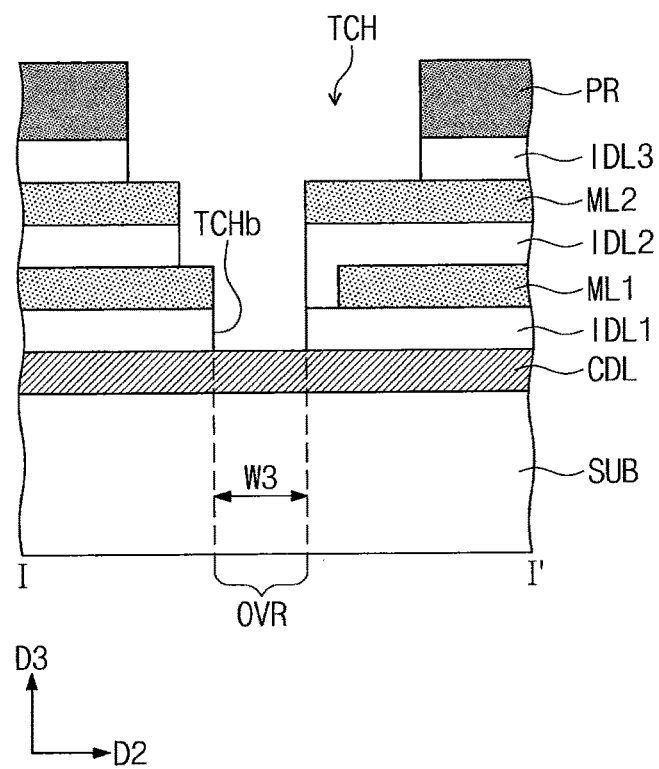

Referring to FIGS. 3A and 3B, a third insulating layer IDL3 may be formed on the second mask layer ML2. The third insulating layer IDL3 be in or may fill the second opening OP2. A photoresist pattern PR may be formed on the second mask layer ML2. The photoresist pattern PR may define a position and a shape of a through contact TCT to be described below.

A through contact hole TCH may be formed by etching first to third insulating layers IDL1, IDL2, and IDL3 using the photoresist pattern PR as an etch mask. The etching process may be an anisotropic etching process. The etching process may be performed using an etch recipe capable of selectively etching the first to third insulating layers IDL1, IDL2, and IDL3. For example, the etching process may be performed to suppress or prevent the first and second mask layers ML1 and ML2 from being etching or damaged. In other words, the first and second mask layers ML1 and ML2 may serve as an etch mask for the etching process. The etching process may be performed to expose a top surface of the conductive layer CDL.

A width of the through contact hole TCH in the second direction D2 may decrease with decreasing distance from the conductive layer CDL with respect to the photoresist pattern PR (i.e., in the third direction D3). A width of a bottom portion TCHb of the through contact hole TCH may have substantially the same width (i.e., the third width W3) as the overlap region OVR. In other words, a planar size of the bottom portion TCHb of the through contact hole TCH may be substantially equal to the planar size of the overlap region OVR. This may be because only a portion of the first insulating layer IDL1 located below the overlap region OVR is selectively etched during the etching process.

Figure 4A:
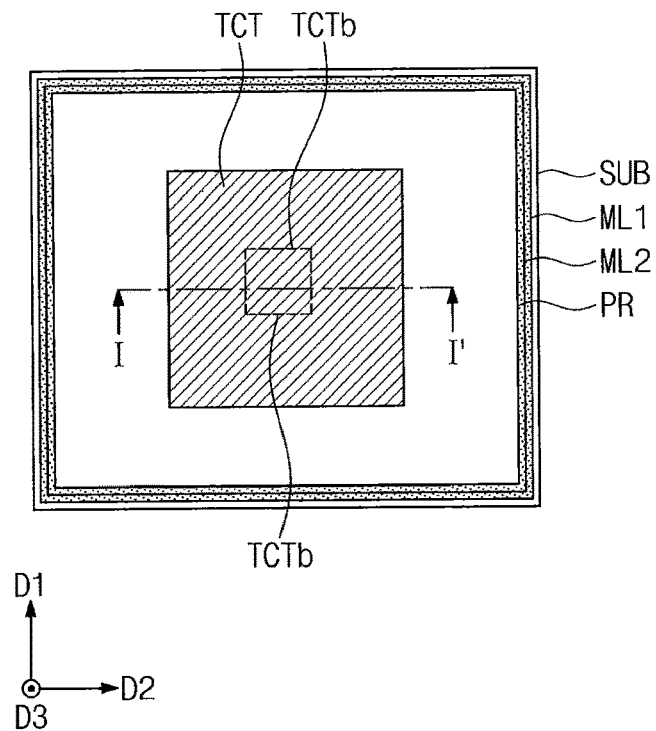
Figure 4B:
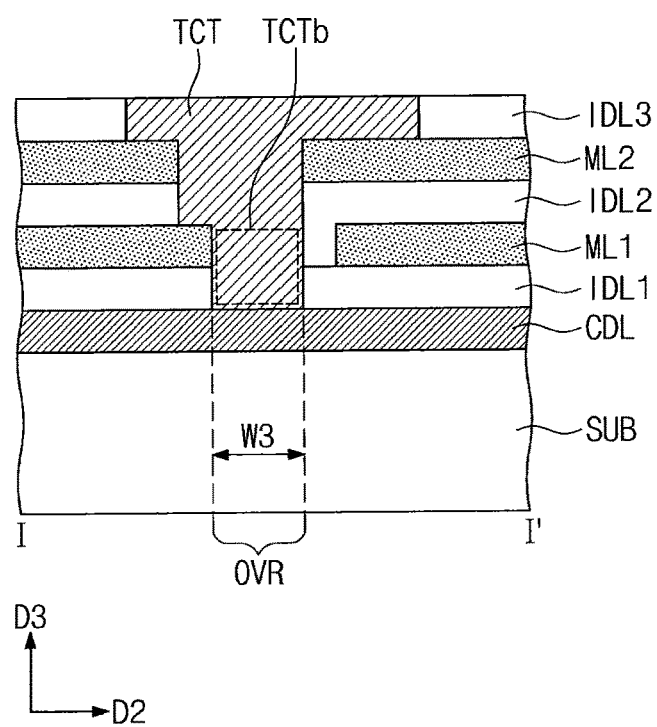

Referring to FIGS. 4A and 4B, the through contact TCT may be formed by at least partially filling the through contact hole TCH with a conductive material. The photoresist pattern PR may be selectively removed. A bottom portion TCTb of the through contact TCT may be in contact with the top surface of the conductive layer CDL. A width of the bottom portion TCTb of the through contact TCT may have substantially the same width (i.e., the third width W3) as the overlap region OVR. In other words, a planar size of the bottom portion TCTb of the through contact TCT may be substantially equal to the planar size of the overlap region OVR.

In some embodiments, since the first opening OP1 of the first mask layer ML1 and the second opening OP2 of the second mask layer ML2 are formed to be offset from each other, the planar size of the bottom portion TCTb of the through contact TCT may be adjusted to a size that is smaller than the planar size of each of the first and second openings OP1 and OP2. That is, according to some embodiments of the inventive concept, the bottom portion TCTb of the through contact TCT can be formed to have a pattern size smaller than the minimum value of pattern sizes that can be achieved by the exposure process.

Figure 5:
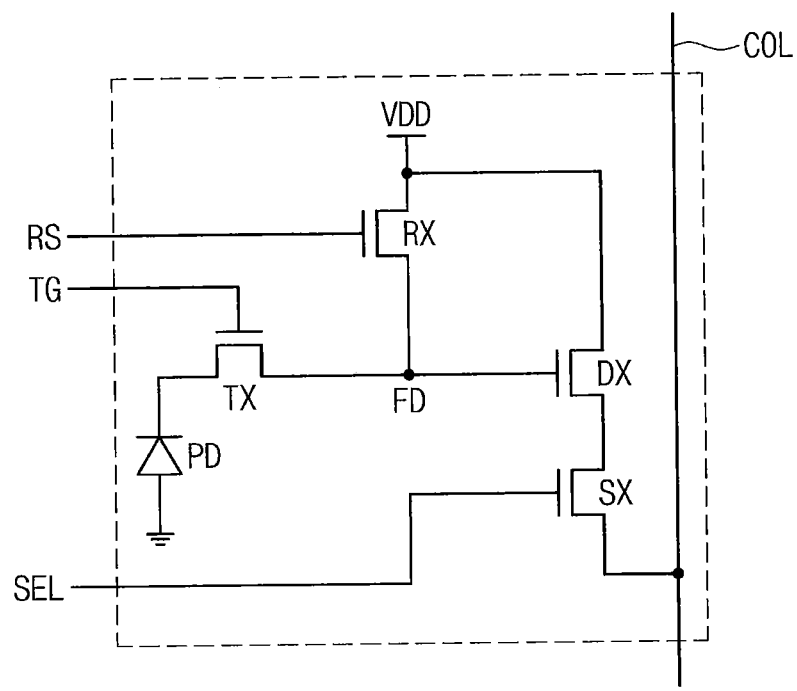
FIG. 5 is a circuit diagram illustrating an example of a unit pixel included in a pixel array according to some embodiments of the inventive concept.

FIG. 5 is a circuit diagram illustrating an example of a unit pixel included in a pixel array according to some embodiments of the inventive concept.

Referring to FIG. 5, a unit pixel in a pixel array PA may include a photodiode PD, which is used as a photo-sensitive device. The unit pixel may include a transfer transistor TX, a reset transistor RX, a drive transistor DX, and a selection transistor SX, which may provide a readout circuit.

The photodiode PD may receive external light (e.g., visible or infrared light) and generate photocharges from the light. In some embodiments, the unit pixel may include a phototransistor, a photo gate, or a pinned photo diode, along with or instead of the photodiode PD.

The photocharges generated in the photodiode PD may be transferred to a floating diffusion node FD through the transfer transistor TX. For example, when a transfer control signal TG has a first level (e.g., a high level), the transfer transistor TX may be turned on, and the photocharges generated in the photodiode PD may be transferred to the floating diffusion node FD through the turned-on transfer transistor TX.

The drive transistor DX may serve as a source follower buffer amplifier. The drive transistor DX may amplify a signal, based on an amount of the photocharges stored in the floating diffusion node FD. The selection transistor SX may transfer the amplified signal to a column line COL, in response to a selection signal SEL. The floating diffusion node FD may be reset by the reset transistor RX. The reset transistor RX may be under the control of a reset signal RS. For example, when a reset signal RS has a first level (e.g. a high level), the reset transistor RX may be turned on, and the floating diffusion node FD may be reset.

Figure 6:
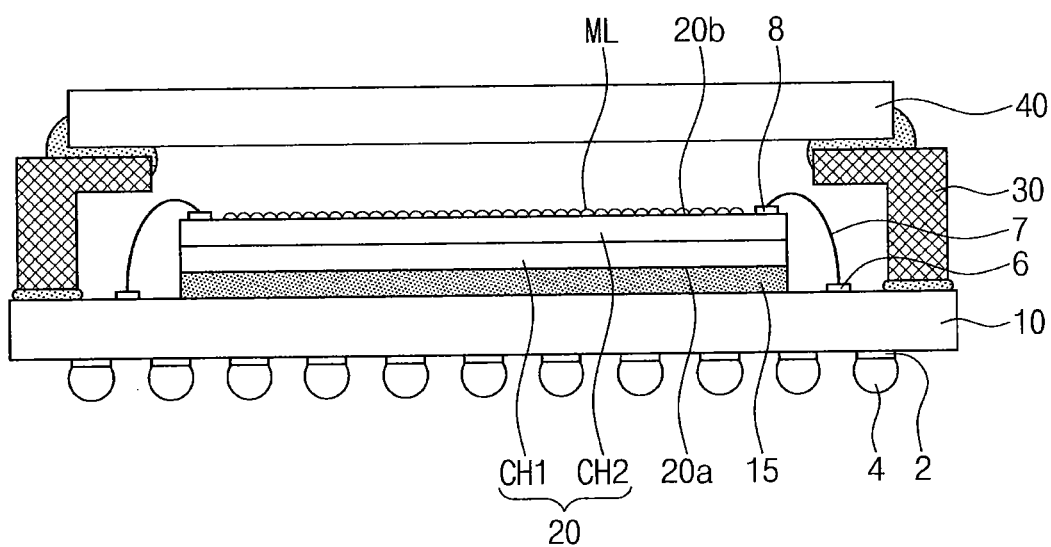
FIG. 6 is a sectional view illustrating a semiconductor package, in which a semiconductor device according to some embodiments of the inventive concept is mounted.
Figure 7:
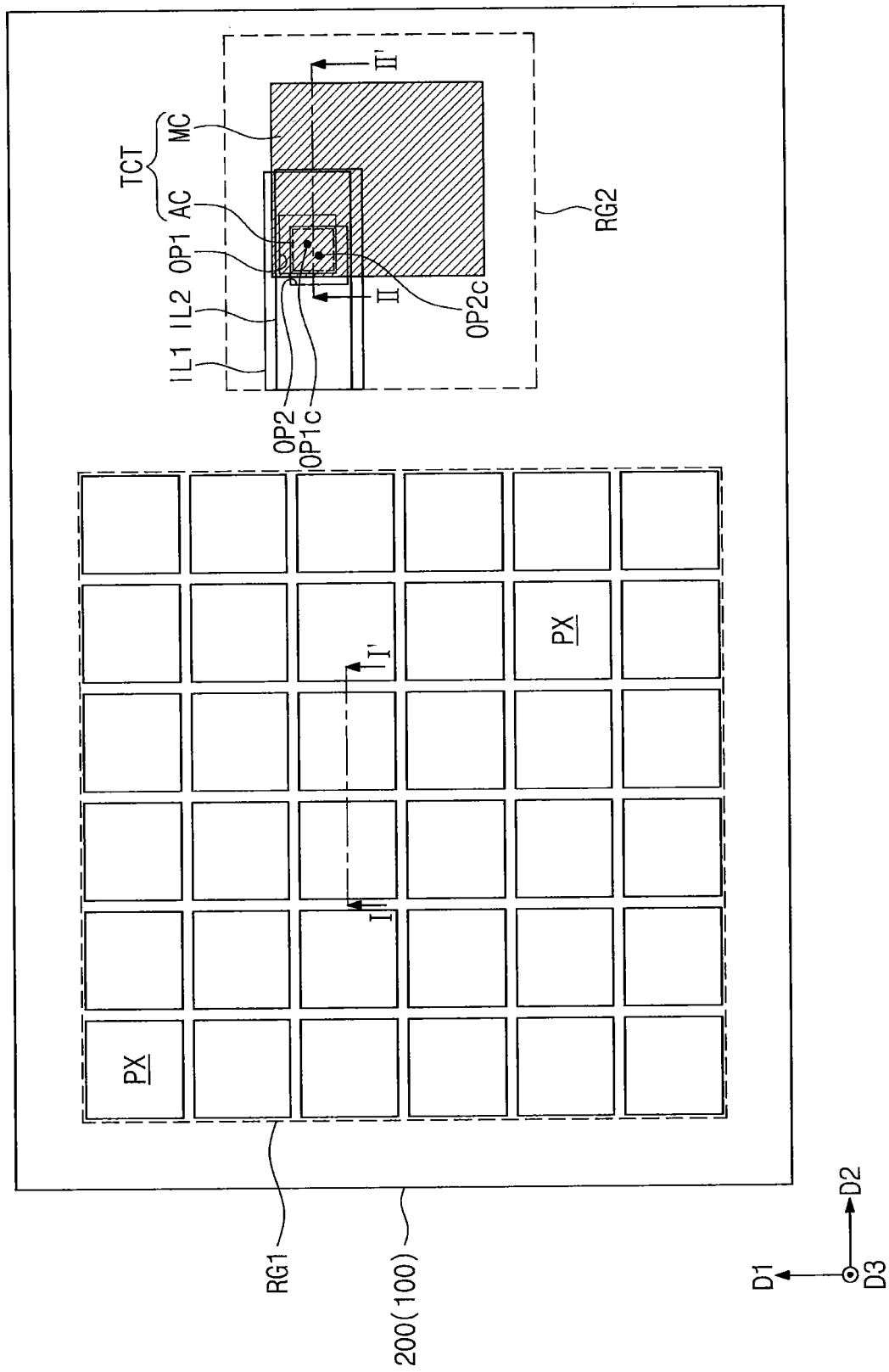
FIG. 7 is a plan view illustrating a semiconductor device according to some embodiments of the inventive concept.
Figure 8:
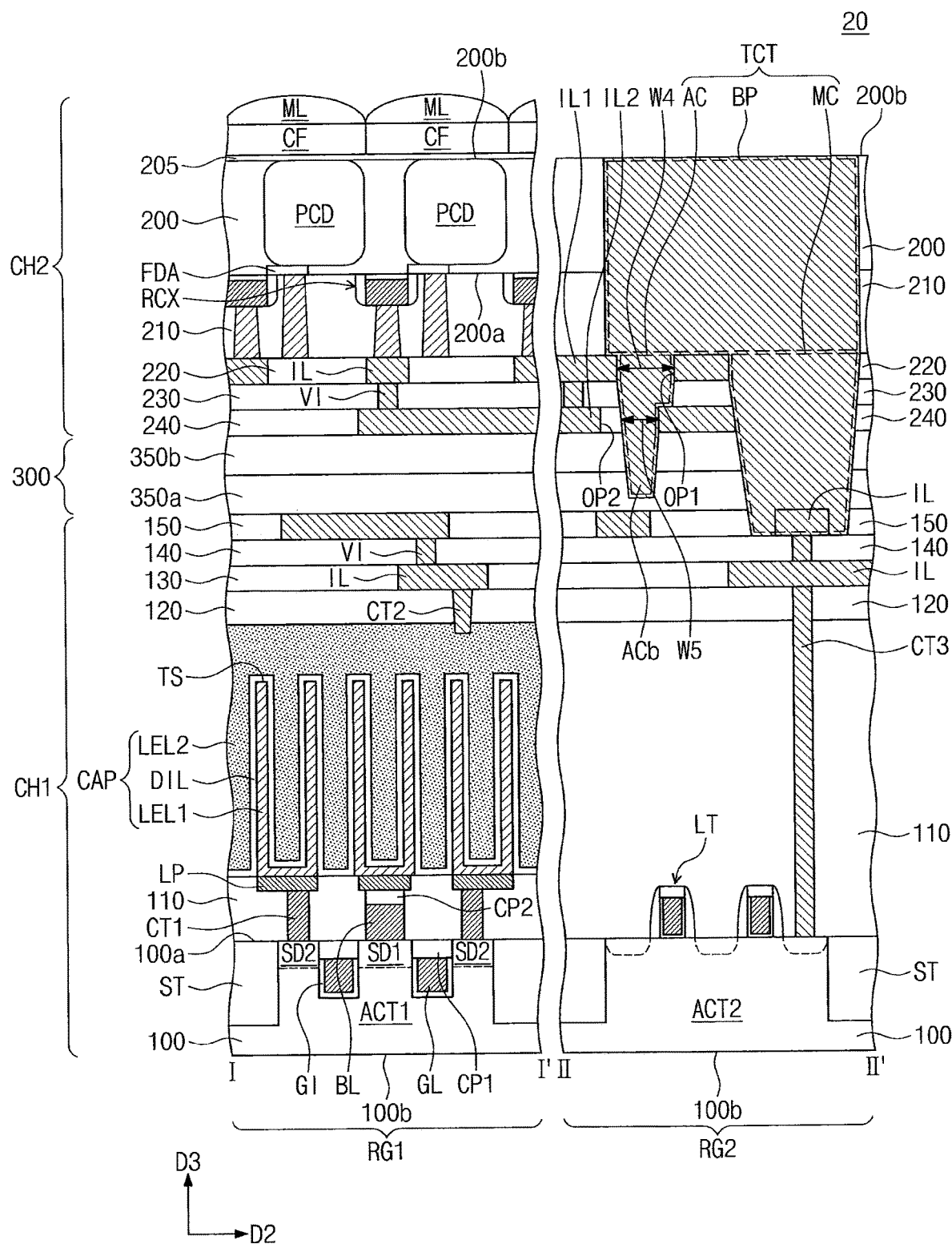
FIG. 8 is a sectional view taken along lines I-I' and II-IP of FIG. 7.

FIG. 6 is a sectional view illustrating a semiconductor package, in which a semiconductor device according to some embodiments of the inventive concept is mounted. FIG. 7 is a plan view illustrating a semiconductor device according to some embodiments of the inventive concept. FIG. 8 is a sectional view taken along lines I-I' and II-IP of FIG. 7.

Referring to FIGS. 6, 7, and 8, a semiconductor device 20 may be mounted on a package substrate 10. In some embodiments, the semiconductor device 20 may be an image sensor chip. A transparent substrate 40 may be provided on the semiconductor device 20. A holder 30 may be provided between the package substrate 10 and the transparent substrate 40. The holder 30 may support the transparent substrate 40. The holder 30 may be configured to separate the transparent substrate 40 vertically from the semiconductor device 20.

The semiconductor device 20 may have a first surface 20a facing the package substrate 10 and a second surface 20b opposite to the first surface 20a. The semiconductor device 20 may include a first sub chip CH1 and a second sub chip CH2, which are vertically stacked. A plurality of micro lenses ML may be disposed on the second surface 20b of the semiconductor device 20. A first pad 8 for forming electrical connections to the semiconductor device 20 may be spaced apart from the micro lenses ML. The first pad 8 and a second pad 6 on the package substrate may be electrically connected each other through a bonding wire 7.

The first sub chip CH1 may include at least one of a logic region, a memory cell region, a peripheral circuit region, or a signal processing region. The second sub chip CH2 may be a pixel array chip. As an example, the second sub chip CH2 may include a pixel array of an image sensor.

Referring back to FIGS. 7 and 8, the semiconductor device 20 may include the first sub chip CH1, the second sub chip CH2, and an insertion layer 300 between the first and second sub chips CH1 and CH2. The first sub chip CH1 and the second sub chip CH2 may be vertically stacked. The insertion layer 300 may be configured to physically and electrically connect the first and second sub chips CH1 and CH2 to each other.

The first sub chip CH1 may include a first region RG1 and a second region RG2, which are spaced apart from each other. The first region RG1 may be a memory cell region, in which memory devices including memory transistors are disposed. As an example, the first region RG1 may be a memory cell region, in which DRAM devices are disposed. The second region RG2 may be a peripheral circuit region, in which peripheral transistors LT are disposed.

The first sub chip CH1 may include a first substrate 100. The first substrate 100 may include a first surface 100a and a second surface 100b opposite to the first surface 100a. The second surface 100b of the first substrate 100 may be the first surface 20a of the semiconductor device 20 previously described with reference to FIG. 6. In other words, the second surface 100b of the first substrate 100 may be disposed in the semiconductor package to face the package substrate.

Hereinafter, the first region RG1 of the first sub chip CH1 will first be described in more detail below. A device isolation layer ST defining first active regions ACT1 may be provided on the first region RG1 of the first substrate 100. The device isolation layer ST may include at least one of, for example, a silicon oxide layer, a silicon nitride layer, or a silicon oxynitride layer.

Gate lines GL may be provided in the first substrate 100 to cross the first active regions ACT1. The gate lines GL may be buried in the first substrate 100. The gate lines GL may be formed of or include a conductive material. For example, the conductive material may be at least one of doped semiconductor materials (doped silicon, doped germanium, and so forth), conductive metal nitrides (titanium nitride, tantalum nitride, and so forth), metallic materials (tungsten, titanium, tantalum, and so forth), or metal-semiconductor compounds (tungsten silicide, cobalt silicide, titanium silicide, and so forth).

A gate insulating pattern GI may be interposed between each of the gate lines GL and the first active region ACT1. The gate insulating pattern GI may include, for example, a silicon oxide layer, a silicon nitride layer, or a silicon oxynitride layer.

A first capping pattern CP1 may be provided on a top surface of each of the gate lines GL. A top surface of the first capping pattern CP1 may be substantially coplanar with the first surface 100a of the first substrate 100. As an example, the first capping pattern CP1 may include a silicon nitride layer or a silicon oxynitride layer.

A first impurity region SD1 and a pair of second impurity regions SD2 may be provided in each of the first active regions ACT1. The pair of the second impurity regions SD2 may be spaced apart from each other, in a third direction D3, with the first impurity region SD1 interposed therebetween.

The first impurity region SD1 may be provided in the first active region ACT1 between an adjacent pair of the gate lines GL. The second impurity regions SD2 may be provided in two opposite portions of the first active region ACT1, which are located at both sides of the pair of the gate lines GL. The second impurity regions SD2 may be spaced apart from each other with the pair of the gate lines GL interposed therebetween. The first impurity region SD1 may have the same conductivity type as that of the second impurity region SD2.

A first lower insulating layer 110 may be provided on the first surface 100a of the first substrate 100 to cover and/or overlap the first active regions ACT1. The first lower insulating layer 110 may include a silicon oxide layer or a silicon oxynitride layer.

Bit lines BL may be provided in the first lower insulating layer 110. Each of the bit lines BL may be electrically connected to the first impurity region SD1. The bit lines BL may include at least one of, for example, doped semiconductor materials, conductive metal nitrides, metallic materials, or metal-semiconductor compounds. A second capping pattern CP2 may be provided on a top surface of each of the bit lines BL. The second capping pattern CP2 may include, for example, a silicon nitride layer or a silicon oxynitride layer.

First contacts CT1 and landing pads LP may be provided in the first lower insulating layer 110. Each of the landing pads LP may be disposed on the first contact CT1. Each of the first contacts CT1 may be electrically connected to the second impurity region SD2. The first contacts CT1 and the landing pads LP may include at least one of conductive materials, such as doped silicon or metallic materials.

Capacitors CAP may be disposed on the first lower insulating layer 110. Each of the capacitors CAP may include a first electrode LEL1, a second electrode LEL2 and a dielectric layer DIL interposed between the first electrode LEL1 and the second electrode LEL2. The first electrodes LEL1 may be disposed on the landing pads LP, respectively. Each of the first electrodes LEL1 may be electrically connected to the second impurity region SD2 through the landing pad LP and the first contact CT1.

Each of the first electrodes LEL1 may be a cylindrical or cup-shaped pattern having a bottom portion and a sidewall portion vertically extended from the bottom portion. The bottom and sidewall portions of each of the first electrodes LEL1 may have substantially the same thickness. The first electrodes LEL1 may have substantially the same planar diameter.

The first electrodes LEL1 may include at least one of doped semiconductor materials, conductive metal nitrides, metallic materials, or metal-semiconductor compounds. As an example, the first electrodes LEL1 may include a metal nitride layer (e.g., a titanium nitride layer (TiN), a titanium silicon nitride layer (TiSiN), a titanium aluminum nitride layer (TiAlN), a tantalum nitride layer (TaN), a tantalum silicon nitride layer (TaSiN), a tantalum aluminum nitride layer (TaAlN), or a tungsten nitride layer (WN)).

The dielectric layer DIL may be provided on surfaces of the first electrodes LEL1 to have a uniform thickness. For example, the dielectric layer DIL may include at least one of high-k dielectric materials (e.g., $HfO_2$, $ZrO_2$, $Al_2O_3$, $La_2O_3$, $Ta_2O_3$ and $TiO_2$).

The second electrode LEL2 may be provided on the dielectric layer DIL. The second electrode LEL2 may cover, surround, and/or overlap a plurality of the first electrodes LEL1 and the dielectric layer DIL may be interposed between the second electrode LEL2 and the first electrodes LEL1. A portion of the second electrode LEL2 may fill an internal space of the first electrode LEL1 of the cylindrical or cup shape. The second electrode LEL2 may include at least one of doped semiconductor materials, conductive metal nitrides, metallic materials, or metal-semiconductor compounds. As an example, the second electrode LEL2 may include a metal nitride layer and a semiconductor layer, which are sequentially stacked.

Second to fifth lower insulating layers 120, 130, 140, and 150 may be stacked on the capacitor CAP. At least one second contact CT2 may be provided to penetrate the second lower insulating layer 120 and to be electrically connected to the second electrode LEL2. Interconnection lines IL and via plugs VI may be provided in the third to fifth lower insulating layers 130, 140, and 150. The via plugs VI may connect the interconnection lines IL, which are located at different vertical levels, to each other. As an example, the interconnection lines IL of the first sub chip CH1 may be electrically connected to the capacitor CAP through the second contact CT2. The interconnection lines IL of the first sub chip CH1 may include a lower interconnection line of the semiconductor device 20.

Hereinafter, the second region RG2 of the first sub chip CH1 will be described in more detail. The device isolation layer ST may be provided on the second region RG2 of the first substrate 100. The device isolation layer ST may define second active regions ACT2 in the second region RG2 of the first substrate 100.

The peripheral transistors LT may be provided on the second active region ACT2. In detail, the peripheral transistor LT may include a gate electrode, which is disposed to cross the second active region ACT2, and impurity regions, which are formed in upper regions of the second active region ACT2.

The first to fifth lower insulating layers 110, 120, 130, 140, and 150 may be sequentially formed on the peripheral transistors LT. The first lower insulating layer 110 on the second region RG2 may cover the peripheral transistors LT. At least one third contact CT3 may be provided to penetrate the second lower insulating layer 120 and the first lower insulating layer 110 and to be electrically connected to the peripheral transistor LT. The interconnection lines IL and the via plugs VI may be provided in the third to fifth lower insulating layers 130, 140, and 150.

The second sub chip CH2 may include the first region RG1 and the second region RG2, which are spaced apart from each other. The first region RG1 of the second sub chip CH2 may be provided on the first region RG1 of the first sub chip CH1, and the second region RG2 of the second sub chip CH2 may be provided on the second region RG2 of the first sub chip CH1.

The first region RG1 of the second sub chip CH2 may be an image sensor region, in which image sensors are disposed. The second region RG2 of the second sub chip CH2 may be a peripheral region. As an example, a pad 8 on the second surface 20b of the semiconductor device 20 may be disposed on the second region RG2 of the second sub chip CH2.

The second sub chip CH2 may include a second substrate 200 and photoelectric conversion devices PCD, floating diffusion regions FDA, and readout circuit devices RCX, which are formed on the second substrate 200. As an example, the second substrate 200 may be a p-type semiconductor substrate doped with impurities.

The readout circuit devices RCX may be disposed on a first surface 200a of the second substrate 200. The readout circuit devices RCX may include a plurality of transistors (e.g., the transfer transistor TX, the reset transistor RX, the drive transistor DX, and the selection transistor SX of FIG. 5), which are used to transfer or amplify an electric signal (e.g., photocharges) corresponding to an incident light, as discussed in detail with respect to FIG. 5.

Color filters CF and the micro lenses ML may be disposed on a second surface 200b of the second substrate 200 to provide the incident light to the photoelectric conversion devices PCD. The second surface 200b may be opposite to the first surface 200a.

Each of the photoelectric conversion devices PCD may include a photodiode. The photoelectric conversion devices PCD may be disposed in the second substrate 200. The photoelectric conversion devices PCD may produce photocharges corresponding to an incident light. For example, an electron-hole pair corresponding to an incident light may be produced in each of the photoelectric conversion devices PCD. The photoelectric conversion devices PCD may be doped to have a conductivity type (e.g., n-type) different from the second substrate 200.

Each of the color filters CF may be disposed on a corresponding one of the photoelectric conversion devices PCD. The color filters CF may be arranged in a matrix shape to provide a color filter array.

In some embodiments, the color filter array may be provided in the form of a Bayer pattern including red, green, and blue filters. Each of the color filters CF may be one of the red, green, and blue filters.

In some embodiments, the color filter array may be provided in the form of Bayer pattern including yellow, magenta, and cyan filters. Each of the color filters CF may be one of the yellow, magenta, and cyan filters.

Each of the micro lenses ML may be disposed on a corresponding one of the color filters CF. Each of the micro lenses ML may adjust a path of an incident light to allow the incident light to be focused the photoelectric conversion device PCD disposed therebelow. The micro lenses ML may be arranged in a matrix shape to provide a micro lens array.

An anti-reflection layer 205 may be provided between the second surface 200b of the second substrate 200 and the color filters CF. The anti-reflection layer 205 may prevent the incident light from being reflected by the second surface 200b of the second substrate 200. As an example, the anti-reflection layer 205 may be a multi-layered structure, in which at least two films of different refractive indices are alternately stacked. If the number of the stacked films is increased, it may be possible to increase an amount of light incident to photoelectric conversion devices PCD.

First to fourth upper insulating layers 210, 220, 230, and 240 may be stacked on the first surface 200a of the second substrate 200. The interconnection lines IL and the via plugs VI may be provided in the first to fourth upper insulating layers 210, 220, 230, and 240. The via plugs VI may connect the interconnection lines IL, which are located at different vertical levels with respect to the first substrate 100 and/or the second substrate 200, to each other. As an example, the interconnection lines IL of the second sub chip CH2 may be electrically connected to the readout circuit devices RCX. The interconnection lines IL of the second sub chip CH2 may include an upper interconnection line of the semiconductor device 20.

The photoelectric conversion devices PCD of the second sub chip CH2 may be configured to produce photocharges from an incident light to be incident through the second surface 200b of the second substrate 200. In other words, the semiconductor device 20 according to the present embodiment may be a backside illuminated image sensor (BIS).

The insertion layer 300 may be interposed between the first and second sub chips CH1 and CH2. The insertion layer 300 may connect the first sub chip CH1 and the second sub chip CH2 with each other physically. The first sub chip CH1 and the second sub chip CH2 may be attached to each other by the insertion layer 300. The insertion layer 300 may include a first insulating layer 350a and a second insulating layer 350b. As an example, the first and second insulating layers 350a and 350b may be formed of or include silicon oxide.

The through contact TCT may be provided on the second region RG2 of the semiconductor device 20. The through contact TCT may be vertically extended from the second substrate 200 of the second sub chip CH2 to the fifth lower insulating layer 150 of the first sub chip CH1. In other words, the through contact TCT may be provided to penetrate the second sub chip CH2 and the insertion layer 300.

The through contact TCT may be in contact with the interconnection lines IL of the second sub chip CH2. The through contact TCT may be in contact with the uppermost line of the interconnection line IL of the first sub chip CH1. The through contact TCT may electrically connect the interconnection lines IL of the second sub chip CH2 with the uppermost line of the interconnection line IL of the first sub chip CH1. In other words, the first sub chip CH1 and the second sub chip CH2 may be electrically connected to each other by the through contact TCT.

The through contact TCT may include a body portion BP, an auxiliary contact AC vertically extended from the body portion BP toward the first sub chip CH1, and a main contact MC vertically extended from the body portion BP toward the first sub chip CH1.

In detail, the interconnection lines IL of the second sub chip CH2 may include a first interconnection line IL1 and a second interconnection line IL2 disposed on the second region RG2. The first interconnection line IL1 may be provided in the second upper insulating layer 220, and the second interconnection line IL2 may be provided in the fourth upper insulating layer 240. The first interconnection line IL1 may be closer to the second substrate 200 that the second interconnection line IL2. In other words, the first interconnection line IL1 may be a lower-level interconnection line of the second sub chip CH2, and the second interconnection line IL2 may be an upper-level interconnection line of the second sub chip CH2.

The body portion BP may be provided on the first interconnection line ILL A top surface of the body portion BP may be substantially coplanar with the second surface 200b of the second substrate 200. A bottom surface of the body portion BP may be in contact with the top surface of the first interconnection line IL1.

The main contact MC may be extended from the bottom surface of the body portion BP toward the first sub chip CH1. The main contact MC may penetrate the insertion layer 300 and may be coupled to the uppermost line of the interconnection line IL of the first sub chip CH1 The bottom surface of the main contact MC may be lower than the bottom surface of the auxiliary contact AC. In other words, a vertical distance between the bottom surface of the main contact MC and the first substrate 100 may be shorter than a vertical distance between the bottom surface of the auxiliary contact AC and the first substrate 100. The bottom portion of the main contact MC may be in direct contact with the uppermost line of the interconnection line IL of the first sub chip CH1. The main contact MC, which is extended toward the first sub chip CH1, may be in contact with a side surface of the first interconnection line IL1 and a side surface of the second interconnection line IL2.

The first interconnection line IL1 may have the first opening OP1, and the second interconnection line IL2 may have the second opening OP2. The first opening OP1 and the second opening OP2 may be horizontally offset from each other. As an example, the center of the first opening OP1 may be offset from the center of the second opening OP2 in one or both of the first and second directions D1 and D2.

The auxiliary contact AC may pass through the first opening OP1 and the second opening OP2 and may be vertically extended toward the first sub chip CH1. A width of the auxiliary contact AC in the second direction D2 may decrease with decreasing distance from the first sub chip CH1. In particular, the width of the auxiliary contact AC may be abruptly decreased in the second opening OP2. For example, the auxiliary contact AC may have a fourth width W4 in the first opening OP1 and a fifth width W5 in the second opening OP2. The fifth width W5 may be smaller than the fourth width W4.

A planar shape of the bottom portion of the auxiliary contact AC may be defined by an overlap region between the first opening OP1 and the second opening OP2. The width of the bottom portion of the auxiliary contact AC may be substantially equal to or less than a width of the overlap region between the first and second openings OP1 and OP2.

The auxiliary contact AC may be spaced apart from the uppermost line of the interconnection line IL of the first sub chip CH1. The bottom surface of the auxiliary contact AC may be located at a level higher than a top surface of the uppermost line of the interconnection line IL of the first sub chip CH1. The auxiliary contact AC may not penetrate the entirety of the insertion layer 300. A level of the bottom surface of the auxiliary contact AC may be higher than a level of the bottom surface of the insertion layer 300 and may be lower than a level of the top surface of the insertion layer 300.

The auxiliary contact AC may be in contact with the first interconnection line IL1 and the second interconnection line IL2. The auxiliary contact AC may increase a contact area between the through contact TCT and the interconnection lines IL of the second sub chip CH2. Such an increase in area of the auxiliary contact AC may lead to a reduction in resistance between the through contact TCT and the interconnection lines IL of the second sub chip CH2. In addition, the auxiliary contact AC may be configured to increase a physical adhesion strength of the through contact TCT and the second sub chip CH2. The auxiliary contact AC may play a role like a nail and may fix the through contact TCT to the second sub chip CH2.

FIGS. 9 to 13 are sectional views, which are taken along lines I-I' and II-II' of FIG. 7 to illustrate a method of fabricating a semiconductor device according to an embodiment of the inventive concept. For concise description, an element previously described with reference to FIGS. 6 to 8 may be identified by the same reference number without repeating an overlapping description thereof.

Figure 9:
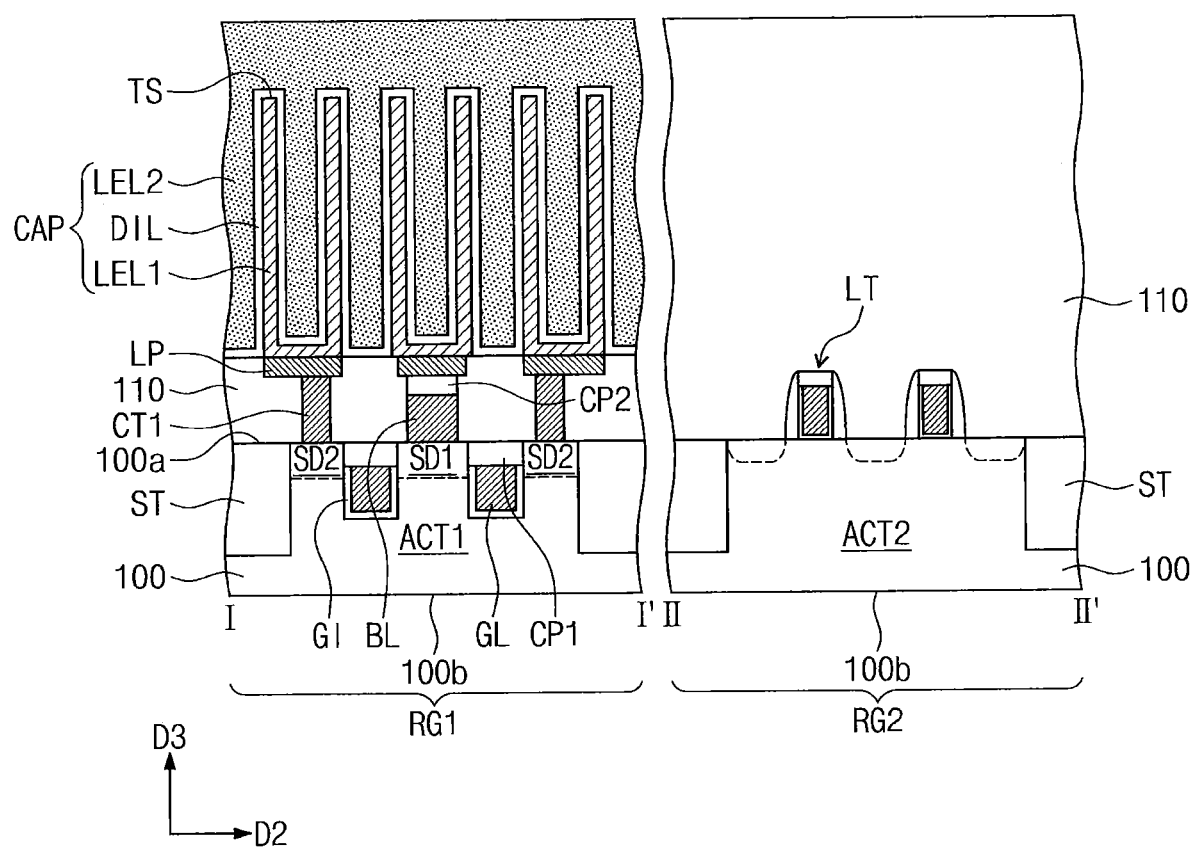
FIGS. 9 to 13 are sectional views, which are taken along lines I-I' and II-II' of FIG. 7 to illustrate a method of fabricating a semiconductor device according to some embodiments of the inventive concept.

Referring to FIG. 9, the first substrate 100 including the first region RG1 and the second region RG2 may be provided. The device isolation layer ST may be formed in the first substrate 100. The device isolation layer ST may be formed by using a shallow trench isolation (STI) process. The device isolation layer ST of the first region RG1 may define the first active regions ACT1 of the first substrate 100. The device isolation layer ST of the second region RG2 may define the second active regions ACT2 of the first substrate 100.

The gate lines GL may be formed in an upper portion of the first substrate 100 to cross the first active regions ACT1. The gate insulating pattern GI may be formed between each of the gate lines GL and the first active region ACT1. The formation of the gate lines GL and the gate insulating patterns GI may include etching the first active regions ACT1 and the device isolation layer ST to form line-shaped trenches, forming a gate insulating layer to fill at least a portion of each of the trenches, and forming a conductive layer to fill the remaining portion of each of the trenches. The first capping patterns CP1 may be formed on the gate lines GL.

An ion implantation process may be performed on the first active regions ACT1 to form the first impurity region SD1 and a pair of the second impurity regions SD2 in each of the first active regions ACT1. The first lower insulating layer 110 may be formed on the first substrate 100.

The bit lines BL, the first contacts CT1, and the landing pads LP may be formed in the first lower insulating layer 110 of the first region RG1. Each of the bit lines BL may be formed to be electrically connected to the first impurity region SD1. Each of the first contacts CT1 may be formed to be electrically connected to the second impurity region SD2. Each of the landing pads LP may be formed on the first contact CT1.

The peripheral transistors LT may be formed in the first lower insulating layer 110 of the second region RG2. In some embodiments, at least a portion of each of the peripheral transistors LT may be formed during the formation of the bit lines BL.

The capacitors CAP may be formed on the first lower insulating layer 110 of the first region RG1. The formation of the capacitors CAP may include forming the first electrodes LEL1 on the landing pads LP, respectively, conformally forming the dielectric layer DIL on the first electrodes LEL1, and forming the second electrode LEL2 on the dielectric layer DIL.

Figure 10:
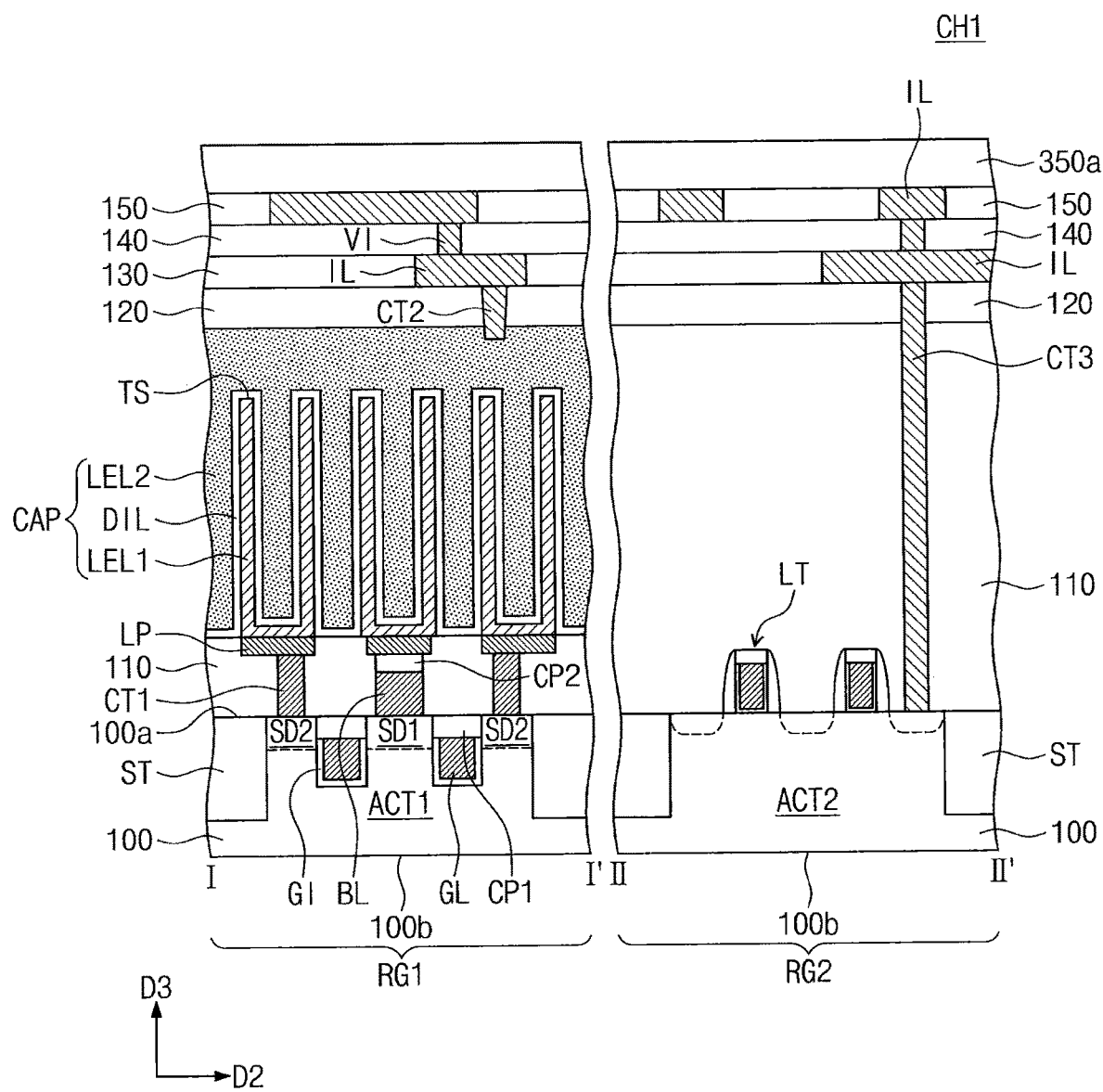

Referring to FIG. 10, the second to fifth lower insulating layers 120, 130, 140, and 150 may be formed on the capacitors CAP and the first lower insulating layer 110. The second contacts CT2 may be formed to penetrate the second lower insulating layer 120 and to be electrically connected to the second electrodes LEL2. At least one third contact CT3 may be formed to penetrate the second lower insulating layer 120 and the first lower insulating layer 110 and to be electrically connected to the peripheral transistor LT. The interconnection lines IL and the via plugs VI may be formed in the third to fifth lower insulating layers 130, 140, and 150. The first insulating layer 350a may be formed on the fifth lower insulating layer 150.

As a result of the above process described with reference to FIGS. 9 and 10, the first sub chip CH1 may be prepared.

Figure 11:
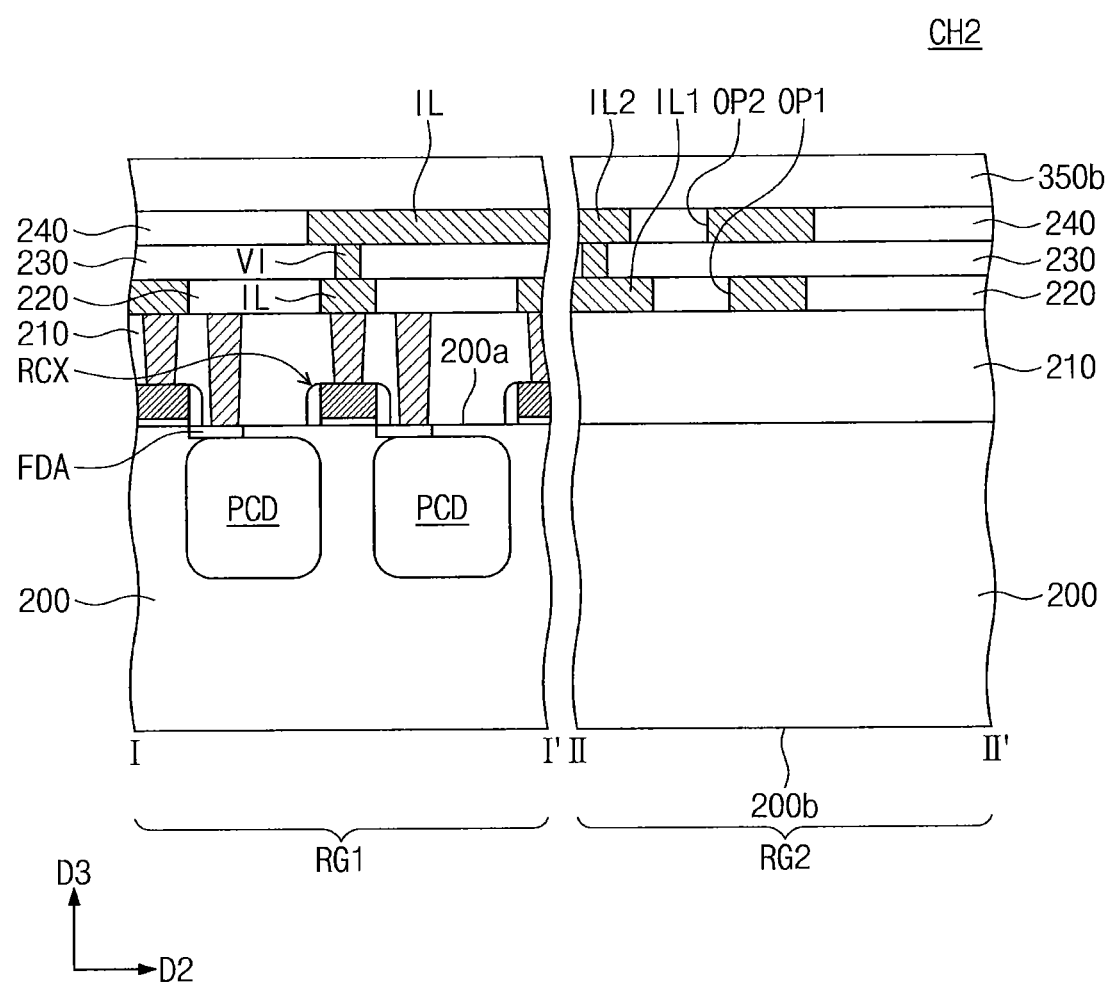

Referring to FIG. 11, the second sub chip CH2 to be stacked on the first sub chip CH1 may be prepared. For example, the photoelectric conversion devices PCD may be formed in the second substrate 200. The readout circuit devices RCX may be formed on the first surface 200a of the second substrate 200. The first to fourth upper insulating layers 210, 220, 230, and 240 may be formed on the readout circuit devices RCX. The via plugs VI and the interconnection lines IL may be formed in the first to fourth upper insulating layers 210, 220, 230, and 240. The second insulating layer 350b may be formed on the fourth upper insulating layer 240.

The formation of the interconnection lines IL may include forming the first interconnection line IL1 in the second upper insulating layer 220 of the second region RG2 and forming the second interconnection line IL2 in the fourth upper insulating layer 240 of the second region RG2. The first interconnection line IL1 may be formed to have the first opening OP1. The second interconnection line IL2 may be formed to have the second opening OP2. In some embodiments, the first opening OP1 may be formed to be offset from the second opening OP2 in the second direction D2.

Figure 12:
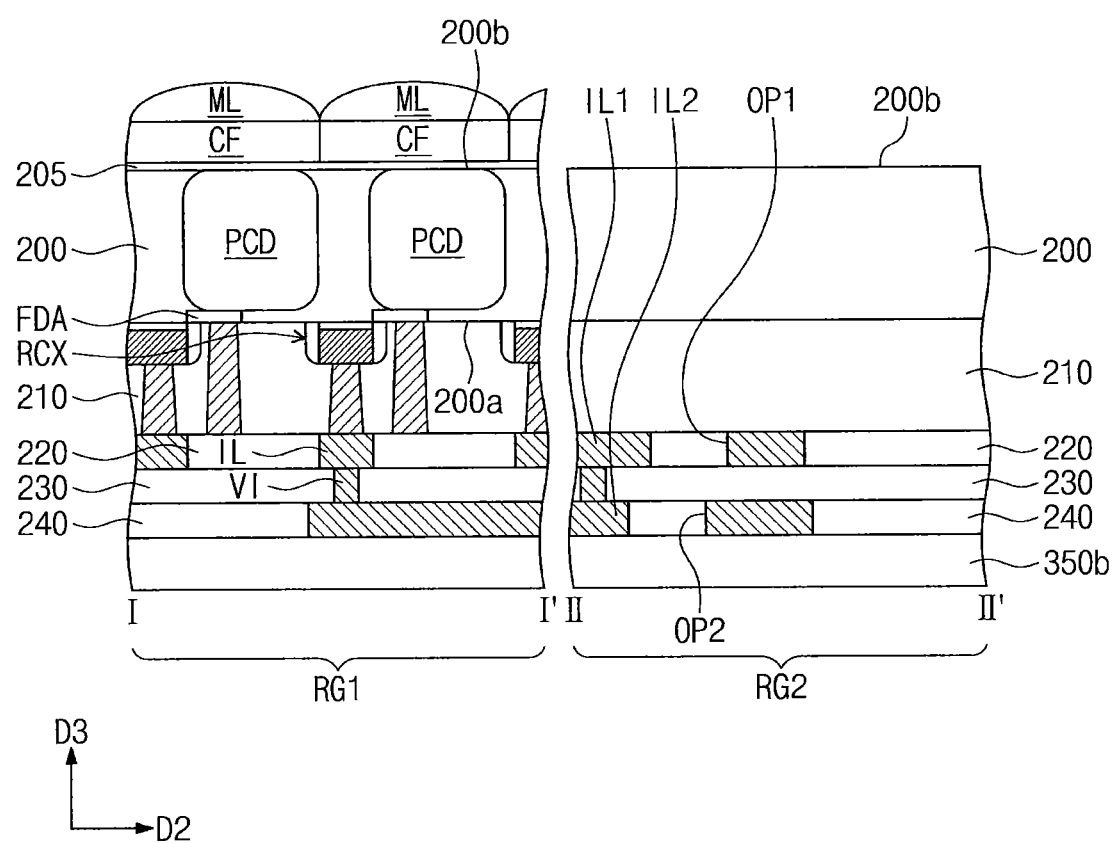

Referring to FIG. 12, the second sub chip CH2 may be inverted and then, a planarization process may be performed on the second surface 200b of the second substrate 200. The anti-reflection layer 205, the color filters CF, and the micro lenses ML may be formed on the second surface 200b of the second substrate 200 of the first region RG1.

Figure 13:
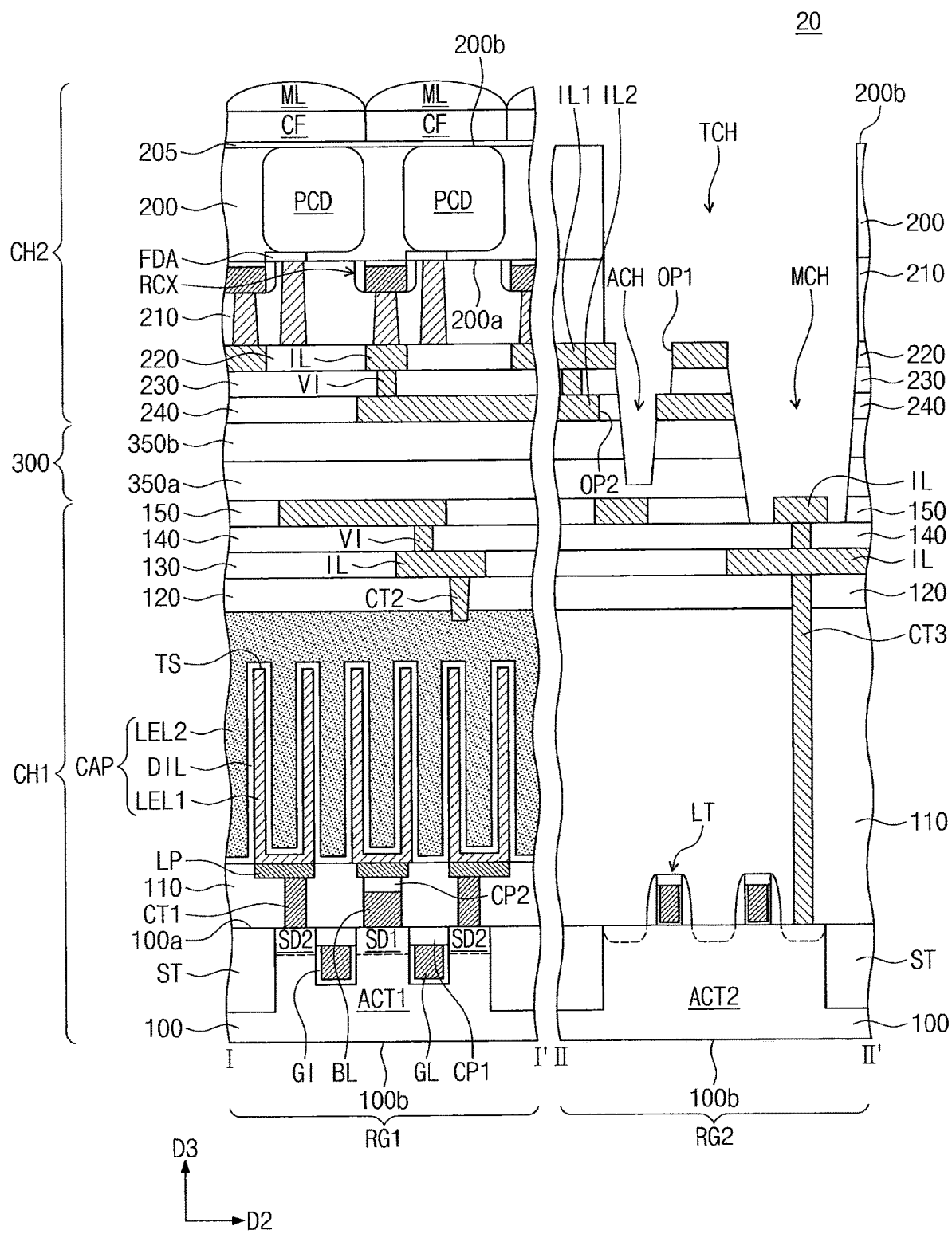

Referring to FIG. 13, the semiconductor device 20 may be formed by stacking the first sub chip CH1 and the second sub chip CH2 prepared through the above processes. In some embodiments, the semiconductor device 20 may be an image sensor chip. The first insulating layer 350a of the first sub chip CH1 and the second insulating layer 350b of the second sub chip CH2 may be attached to each other to form the insertion layer 300. The first sub chip CH1 and the second sub chip CH2 may be physically combined with each other by the insertion layer 300.

The through contact hole TCH may be formed by performing an etching process on the second sub chip CH2 of the second region RG2. The through contact hole TCH may be formed in a manner similar to that described with reference to FIGS. 1A to 3B.

The formation of the through contact hole TCH may include forming a photoresist pattern on the second substrate 200 of the second region RG2 to define the through contact hole TCH and then performing an etching process using the photoresist pattern as an etch mask to expose the uppermost line of the interconnection line IL of the first sub chip CH1. During the etching process, the second substrate 200, the first to fourth upper insulating layers 210, 220, 230, and 240, and the insertion layer 300 may be selectively etched.

During the etching process, the interconnection lines IL may not be etched. During the etching process, the first interconnection line IL1 and the second interconnection line IL2 may be used as an etch mask. In other words, the first interconnection line IL1 and the second interconnection line IL2 may be similar to the first mask layer ML1 and the second mask layer ML2 previously described with reference to FIGS. 1A to 3B.

The through contact hole TCH may include a main contact hole MCH and an auxiliary contact hole ACH. The main contact hole MCH may be formed to expose at least a portion of the uppermost line of the interconnection line IL of the first sub chip CH1.

The auxiliary contact hole ACH may be formed by the first opening OP1 of the first interconnection line IL1 and the second opening OP2 of the second interconnection line IL2. In detail, the auxiliary contact hole ACH may be formed by removing the second upper insulating layer 220 filling the first opening OP1 and the fourth upper insulating layer 240 filling the second opening OP2 through the etching process.

Since the first opening OP1 and the second opening OP2 are offset from each other, the planar size of the bottom portion of the auxiliary contact hole ACH may be less than the planar size of each of the first and second openings OP1 and OP2. The width of the bottom portion of the auxiliary contact hole ACH may be reduced by the first and second openings OP1 and OP2, and in this case, the auxiliary contact hole ACH may be etched to have a depth shallower or less than that of the main contact hole MCH, with respect to the first substrate 100 and/or the second substrate 200. Thus, the auxiliary contact hole ACH may not expose the uppermost line of the interconnection line IL of the first sub chip CH1.

Referring back to FIGS. 7 and 8, the through contact TCT may be formed to fill the through contact hole TCH. The through contact TCT may include the main contact MC filling at least a portion of the main contact hole MCH and/or the auxiliary contact AC filling at least a portion of the auxiliary contact hole ACH. The first sub chip CH1 and the second sub chip CH2 may be electrically connected to each other through the through contact TCT.

Figure 14:
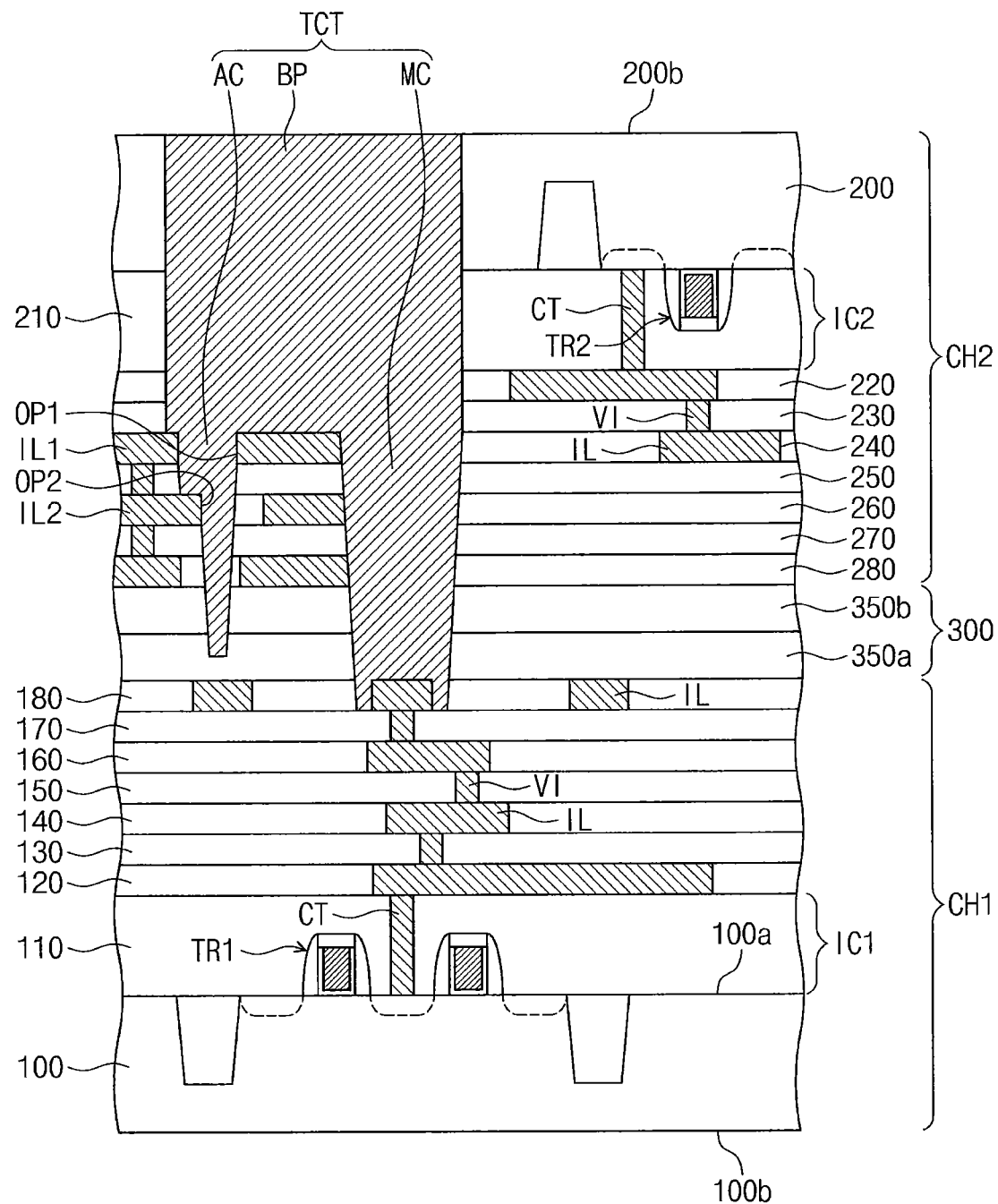
FIG. 14 is a sectional view illustrating a region of a semiconductor device according to some embodiments of the inventive concept.

FIG. 14 is a sectional view illustrating a region of a semiconductor device according to some embodiments of the inventive concept. For concise description, an element previously described with reference to FIGS. 6 to 8 may be identified by the same reference number without repeating an overlapping description thereof.

Referring to FIG. 14, the semiconductor device 20, according to some embodiments of the inventive concept, may include the first sub chip CH1, the second sub chip CH2, and the insertion layer 300 between the first and second sub chips CH1 and CH2. The first sub chip CH1 and the second sub chip CH2 may be vertically stacked, and the insertion layer 300 may connect the first and second sub chips CH1 and CH2 physically to each other.

The first sub chip CH1 may include a first integrated circuit IC1, and the second sub chip CH2 may include a second integrated circuit IC2. As an example, the first sub chip CH1 may be a logic chip. The first integrated circuit IC1 may include logic cells for processing data and/or control information and/or may include power circuits for controlling operations of the logic cells. The second sub chip CH2 may be a memory chip, such as a DRAM chip or a FLASH memory chip. The second integrated circuit IC2 may include memory cells for storing data and/or control information and/or may include power circuits for controlling operations of the memory cells.

The first integrated circuit IC1 may be provided on the first surface 100a of the first substrate 100. The first integrated circuit IC1 may include a plurality of first transistors TR1. The first transistors TR1 may provide the logic cell.

First to eighth lower insulating layers 110-180 may be stacked on the first surface 100a of the first substrate 100. At least one contact CT may pass through the first lower insulating layer 110 and may be electrically connected to the first transistor TR1. The interconnection lines IL and the via plugs VI may be provided in the second to eighth lower insulating layers 120-180.

The second integrated circuit IC2 may be provided on the first surface 200a of the second substrate 200. The second integrated circuit IC2 may include a plurality of second transistors TR2. The second transistors TR2 may provide the memory cells.

First to eighth upper insulating layers 210-280 may be stacked on the first surface 200a of the second substrate 200. At least one contact CT may pass through the first upper insulating layer 210 and may be electrically connected to the second transistor TR2. The interconnection lines IL and the via plugs VI may be provided in the second to eighth upper insulating layers 220-280.

The interconnection lines IL of the second sub chip CH2 may include the first interconnection line IL1 in the fourth upper insulating layer 240 and the second interconnection line IL2 in the sixth upper insulating layer 260. The first interconnection line IL1 may have the first opening OP1, and the second interconnection line IL2 may have the second opening OP2. The first opening OP1 and the second opening OP2 may be horizontally offset from each other.

The semiconductor device 20 may include at least one through contact TCT penetrating the second sub chip CH2. The main contact MC of the through contact TCT may connect the interconnection lines IL of the second sub chip CH2 electrically with the uppermost line of the interconnection line IL of the first sub chip CH1.

The auxiliary contact AC of the through contact TCT may pass through the first opening OP1 of the first interconnection line IL1 and the second opening OP2 of the second interconnection line IL2 and may be vertically extended toward the first sub chip CH1 The planar size of the auxiliary contact AC may be defined by a planar size of the overlap region between the first and second openings OP1 and OP2.

According to some embodiments of the inventive concept, a semiconductor device may include a semiconductor chip, in which two sub chips are stacked. The sub chips may be electrically connected to each other through a through contact of the semiconductor chip. In a method of fabricating a semiconductor device according to some embodiments of the inventive concept, it may be possible to easily adjust a size of an auxiliary contact of the through contact. Thus, process defects may be reduced or prevented, and the through contact may be fastened to the sub chip through the auxiliary contact.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a first sub chip comprising a first substrate and a first plurality of interconnection lines on the first substrate;
   a second sub chip comprising a second substrate and a second plurality of interconnection lines on the second substrate, wherein the second sub chip is stacked on the first sub chip, and wherein the first plurality of interconnection lines of the first sub chip and the second plurality of interconnection lines of the second sub chip are between the first and second substrates; and
   a through contact extending from the second substrate toward the first sub chip to electrically connect the first and second sub chips to each other,
   wherein the second plurality of interconnection lines of the second sub chip comprises a first interconnection line with a first opening and a second interconnection line with a second opening,
   wherein a center of the second opening is horizontally offset from a center of the first opening in a direction parallel to the first substrate and the second substrate,
   wherein the through contact comprises an auxiliary contact that extends in the first opening and the second opening toward the first sub chip, and
   wherein a level of a bottom surface of the auxiliary contact is higher than a level of a top surface of an uppermost interconnection line of the first plurality of interconnection lines of the first sub chip.

2. The semiconductor device of claim 1,
   wherein the auxiliary contact has a first width in the first opening,
   wherein the auxiliary contact has a second width in the second opening, and
   wherein the second width is less than the first width.

3. The semiconductor device of claim 1,
   wherein a bottom portion of the auxiliary contact comprises a planar shape, and
   wherein an overlap region between the first opening and the second opening comprises the planar shape.

4. The semiconductor device of claim 1, further comprising:
   transistors on a first surface of the second substrate on which transistors are formed,
   wherein the second substrate comprises a second surface opposite to the first surface, and
   wherein the through contact vertically extends from the second surface of the second substrate toward the first sub chip.

5. The semiconductor device of claim 1, wherein the through contact further comprises a main contact electrically connected to an uppermost interconnection line of the first sub chip.

6. The semiconductor device of claim 5, wherein the level of the bottom surface of the auxiliary contact is higher than a level of a bottom surface of the main contact.

7. The semiconductor device of claim 5, wherein the main contact is in contact with the first interconnection line and the second interconnection line.

8. The semiconductor device of claim 1,
wherein the second sub chip further comprises photoelectric conversion devices in the second substrate, and
wherein the first sub chip further comprises memory transistors on the first substrate.

9. The semiconductor device of claim 1,
wherein the auxiliary contact has a first width in the first opening,
wherein the auxiliary contact has a second width that is less than the first width in the second opening, and
wherein the second width of the auxiliary contact decreases with increasing distance from the first opening.

10. The semiconductor device of claim 1, further comprising:
an insertion layer that is between the first sub chip and the second sub chip and physically connects the first sub chip to the second sub chip,
wherein the level of the bottom surface of the auxiliary contact is higher than a level of a bottom surface of the insertion layer and is lower than a level of a top surface of the insertion layer.

11. A semiconductor device, comprising:
a first sub chip comprising a first substrate and a first plurality of interconnection lines on the first substrate;
a second sub chip comprising a second substrate and a second plurality of interconnection lines on the second substrate, wherein the second sub chip is stacked on the first sub chip; and
a through contact that penetrates the second sub chip and electrically connects the first and second sub chips to each other,
wherein the second plurality of interconnection lines of the second sub chip comprises a first interconnection line with a first opening and a second interconnection line with a second opening,
wherein a center of the second opening is horizontally offset from a center of the first opening,
wherein the through contact comprises:
an auxiliary contact extending in the first opening and the second opening and toward the first sub chip; and
a main contact electrically connected to an uppermost interconnection line of the first plurality of interconnection lines of the first sub chip, and
wherein a level of a bottom surface of the auxiliary contact is higher than a level of a bottom surface of the main contact.

12. The semiconductor device of claim 11, wherein the level of the bottom surface of the auxiliary contact is higher than a level of a top surface of the uppermost interconnection line of the first sub chip.

13. The semiconductor device of claim 11,
wherein the auxiliary contact has a first width in the first opening,
wherein the auxiliary contact has a second width in the second opening, and
wherein the second width is less than the first width.

14. The semiconductor device of claim 11, further comprising:
transistors on a first surface of the second substrate
wherein the second substrate comprises a second surface opposite to the first surface, and
wherein the through contact vertically extends from the second surface of the second substrate toward the first sub chip.

15. The semiconductor device of claim 11, wherein the main contact is in contact with the first interconnection line and the second interconnection line.

16. A semiconductor device, comprising:
a first substrate;
a lower interconnection line on the first substrate and an upper interconnection line on the lower interconnection line; and
a through contact vertically extending from the upper interconnection line to the lower interconnection line to electrically connect the upper and lower interconnection lines to each other,
wherein the upper interconnection line comprises a first interconnection line having a first opening, and a second interconnection line on the first interconnection line and having a second opening,
wherein a center of the second opening is horizontally offset from a center of the first opening in a direction parallel to the first substrate,
wherein the through contact comprises:
an auxiliary contact extending in the second opening and the first opening and toward the first substrate; and
a main contact electrically connected to the lower interconnection line, and
wherein a level of a bottom surface of the auxiliary contact is higher than a level of a bottom surface of the main contact.

17. The semiconductor device of claim 16, wherein the level of the bottom surface of the auxiliary contact is higher than a level of a top surface of the lower interconnection line.

18. The semiconductor device of claim 16,
wherein the auxiliary contact has a first width in the first opening,
wherein the auxiliary contact has a second width in the second opening, and
wherein the first width is less than the second width.

19. The semiconductor device of claim 16, further comprising:
a second substrate on the upper interconnection line,
wherein the through contact extends from the second substrate to the lower interconnection line through the upper interconnection line.

20. The semiconductor device of claim 16,
wherein a bottom portion of the auxiliary contact comprises a planar shape, and
wherein an overlap region between the first opening and the second opening comprises the planar shape.

* * * * *